(12) United States Patent
Reber et al.

(10) Patent No.: US 8,707,231 B2
(45) Date of Patent: Apr. 22, 2014

(54) METHOD AND SYSTEM FOR DERIVED LAYER CHECKING FOR SEMICONDUCTOR DEVICE DESIGN

(75) Inventors: Douglas M. Reber, Austin, TX (US); Mehul D. Shroff, Austin, TX (US); Edward O. Travis, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/562,443

(22) Filed: Jul. 31, 2012

(65) Prior Publication Data

US 2014/0040839 A1 Feb. 6, 2014

(51) Int. Cl.
| G06F 17/50 | (2006.01) |
| G06F 19/00 | (2011.01) |
| G03F 1/00 | (2012.01) |
| G21K 5/00 | (2006.01) |

(52) U.S. Cl.
CPC ............ G06F 17/5081 (2013.01); G06F 19/00 (2013.01); G03F 1/00 (2013.01); G21K 5/00 (2013.01)
USPC ............... 716/111; 716/106; 716/51; 716/55; 700/98; 700/121; 430/5; 378/35

(58) Field of Classification Search
CPC ....... G06F 17/5081; G06F 19/00; G03F 1/00; G21K 5/00
USPC ................ 716/111, 106, 51, 55; 700/98, 121; 430/5; 378/35
See application file for complete search history.

(56) References Cited

U.S. PATENT DOCUMENTS

| 5,231,590 | A | * | 7/1993 | Kumar et al. ............... 716/55 |
| 6,078,737 | A | | 6/2000 | Suzuki |
| 7,464,350 | B1 | | 12/2008 | Ho |
| 8,225,246 | B2 | * | 7/2012 | Pikus et al. ................ 716/103 |
| 8,589,839 | B2 | * | 11/2013 | Boselli et al. ............. 716/106 |
| 2002/0194575 | A1 | * | 12/2002 | Allen et al. ................. 716/17 |
| 2004/0049747 | A1 | * | 3/2004 | Yamasaki et al. ............ 716/4 |
| 2004/0194040 | A1 | * | 9/2004 | Joshi et al. .................. 716/4 |
| 2005/0216872 | A1 | * | 9/2005 | Sung et al. .................. 716/5 |
| 2005/0216873 | A1 | * | 9/2005 | Singh et al. ................. 716/5 |
| 2005/0278667 | A1 | * | 12/2005 | Boucher et al. .............. 716/4 |
| 2006/0200789 | A1 | * | 9/2006 | Rittman .................... 716/19 |
| 2008/0072191 | A1 | * | 3/2008 | Chang et al. ................. 716/5 |
| 2008/0115102 | A1 | * | 5/2008 | Rittman .................... 716/19 |
| 2009/0326873 | A1 | * | 12/2009 | Wang et al. ................. 703/1 |

(Continued)

OTHER PUBLICATIONS

Luo et al.; "Mask versus Schematic—An Enhanced Design-Verification Flow for First Silicon Success", International Test Conference, IEEE, 2010, pp. 1-9.

*Primary Examiner* — Phallaka Kik
(74) *Attorney, Agent, or Firm* — Jonathan N. Geld (57) ABSTRACT

A system and method are provided for enabling a systematic detection of issues arising during the course of mask generation for a semiconductor device. IC mask layer descriptions are analyzed and information is generated that identifies devices formed by active layers in the masks, along with a description of all layers in proximity to the found devices. The IC mask information is compared to a netlist file generated from the initial as-designed schematic. Determinations can then made, for example, as to whether all intended devices are present, any conflicting layers are in proximity to or interacting with the intended devices, and any unintended devices are present in the mask layers. Steps can then be taken to resolve the issues presented by the problematic devices.

18 Claims, 7 Drawing Sheets

(56) References Cited

U.S. PATENT DOCUMENTS

2010/0169854 A1* 7/2010 Boselli et al. .................. 716/5
2010/0242011 A1* 9/2010 Mukai et al. .................. 716/19
2010/0248481 A1* 9/2010 Schultz ...................... 438/694
2011/0191729 A1* 8/2011 Hart .............................. 716/55
2012/0266117 A1* 10/2012 Pikus et al. ................. 716/103
2013/0311957 A1* 11/2013 Chang et al. ................. 716/50

* cited by examiner

METHOD AND SYSTEM FOR DERIVED LAYER CHECKING FOR SEMICONDUCTOR DEVICE DESIGN

BACKGROUND

1. Field

This disclosure relates generally to semiconductor device design verification, and more specifically, to a method and system for checking generated device mask layers for agreement with design schematics.

2. Related Art

Semiconductor device design and fabrication flow typically involves a sequence of steps that progress from input of a device schematic toward generation of layer masks used in manufacturing the physical device. During the course of this flow, rules and verifications are applied.

An early step in device and fabrication flow involves generation of a physical layout for the device. Verification of the physical layout is typically performed by comparing attributes of the physical layout (e.g., device characteristics and connectivity) with those of the initial as-designed schematic for the device. In addition, the physical layout is subject to design rules checks (DRC) for physical characteristics such as, for example, size and spacing. Once this layout-to-schematic (LVS) verification has been performed, the design tapes out and is passed to post-tapeout operations. Post-tapeout operations provide for generation of integrated circuit (IC) mask layers from the taped-out CAD layers. Certain of these layers may not included in the CAD layers (e.g., p-well layers (PW), n-channel lightly-doped drain layers (NLDD), and the like) and are typically generated by application of computational mask operations (e.g., Boolean or CAD-to-Mask operations). In addition, other post-tapeout operations such as optical proximity correction (OPC) modify the generated IC mask description. Ultimately, in a typical design and fabrication flow, the IC masks are visually inspected for issues that may have arisen during the course of mask layer generation.

The translation of the design description to IC mask shapes through the use of the computational methods and other foundry-level operations can result in IC mask shape and layer interactions that may be problematic in the ultimate device, but which would not be caught by design rules checking and LVS, nor which are easily visually detected. It is therefore desirable to provide a design flow that includes a mechanism for detecting issues that arise during the course of mask generation.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

A system and method are provided for enabling a systematic detection of issues arising during the course of mask generation for a semiconductor device. IC mask layer descriptions are analyzed and information is generated that identifies devices formed by active layers in the masks, along with a description of all layers in proximity to the found devices. The IC mask information is compared to a netlist file generated from the initial as-designed schematic. Determinations can then made, for example, as to whether all intended devices are present, any conflicting layers are in proximity to or interacting with the intended devices, and any unintended devices are present in the mask layers. Steps can then be taken to resolve the issues presented by the problematic devices.

Figure 1A:
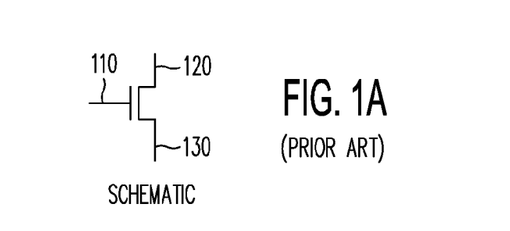
FIGS. 1A and 1B illustrate two aspects of semiconductor device design: a schematic representation (FIG. 1A) and a mask layout (FIG. 1B).
Figure 1B:
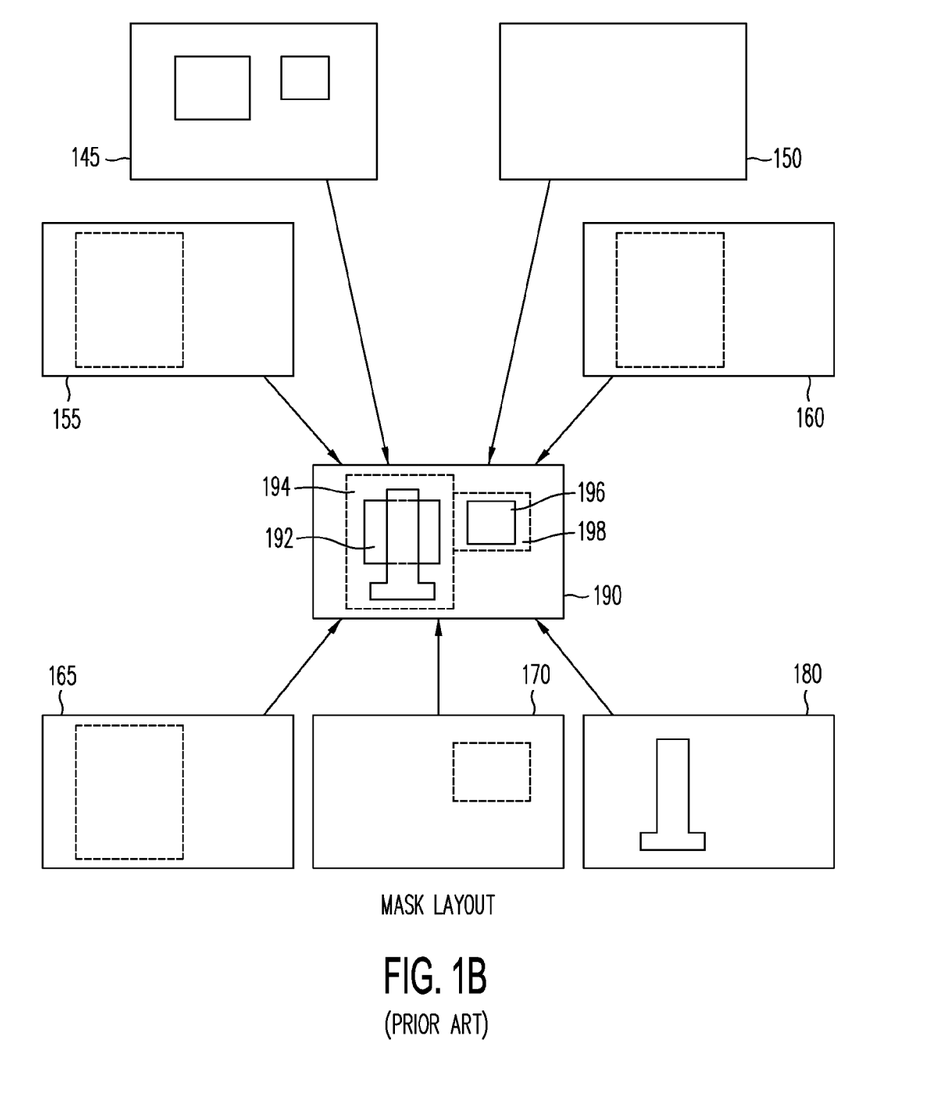

FIGS. 1A and 1B illustrate two aspects of semiconductor device design. Device design begins with a schematic representation of the device. FIG. 1A illustrates a schematic representation of an NFET transistor element that can be used as a basic building block of a semiconductor device. As is well understood in the art, such a transistor can be represented by graphical symbols associated with a gate 110, a source 120, and a drain 130. A variety of physical characteristics can be associated with the schematic representation of the element of the device. In addition, a schematic illustrates connectivity between the various elements of the semiconductor device.

Once a schematic representation of the semiconductor device is completed, a process flow is executed that leads to generation of integrated circuit masks used in production of the semiconductor device. A sequence of mask layers are used to form the individual components of the semiconductor device. Known shapes for the various layers are combined to form the individual elements.

FIG. 1B illustrates a simplified example of a sequence of mask layers combined to form a mask layout of a transistor and an associated well tie. An active layer mask 145, a p-well layer mask 150 (illustrated as the entire region being opened), an N-poly pre-dope mask 155, an NLDD (N-channel lightly doped drain) layer mask 160, an N+ source/drain layer mask 165, a P+ source/drain layer mask 170, and a polysilicon layer mask 180 are all used in conjunction to form mask layout 190. Mask layout 190 includes both a transistor 192 and a well tie 196. As illustrated, transistor 192 is formed in an N+ region 194, while well tie 196 is within a P+ region 198. Polysilicon layer mask 180 is used subsequent to N-poly pre-dope mask 155. Some mask shapes can be formed on the same mask rather than separate masks and vice versa (e.g., an N-type source mask can be formed on a separate mask from an N-type drain mask). Mask shapes can vary according to the application and various layout rules.

Some of the mask layers are generated in response to the schematic devices and others can be computationally generated or modified (e.g., in response to Boolean mask operations and optical proximity correction (OPC)). The mask layers illustrated do not reflect OPC and tiling modifications.

As discussed above, a typical schematic-to-mask flow can include a design verification flow and a CAD-to-mask flow. The design verification flow can include, for example: generation of the schematic using tools such as a schematic editor; generation of a physical layout of the semiconductor device using a set of electronic design automation (EDA) tools; physical verification of the laid out device, using verification suites such as a layout versus schematic (LVS) and design rule checking (DRC); and, generation of a graphical database file (GDS) containing a description of the verified laid out device. Verification, such as LVS, can include comparing the connectivity of primitives in the layout with those of the initial schematic, and attribute matching for each primitive attribute. DRC typically involves a checking to ensure that physical rules for the chosen manufacturing process of the semiconductor device are being followed in the layout. LVS and DRC are typically performed after layout is generated, since the layout is used for these steps.

CAD-to-mask flow can involve steps including, for example: IC mask generation, which can include generation of layers not present in the CAD layers through computational operations, such as: Boolean mask operations; optical proximity correction (OPC), which modifies the CAD layers and computationally generates mask layers to correct for optical effects (e.g. diffusion, scattering, corner rounding, and line-end pullback); and, generation of the final mask sets. Boolean mask operations provide layers that are necessary to the manufacture of operative devices. But rules for applying these additional layers during IC mask generation may cause complications with other device layers. Historically, the IC masks are checked using visual inspection techniques, but these do not always catch problems or potential problems. Embodiments of the present invention provide a more accurate, systematic check of the mask layers.

Figure 2:
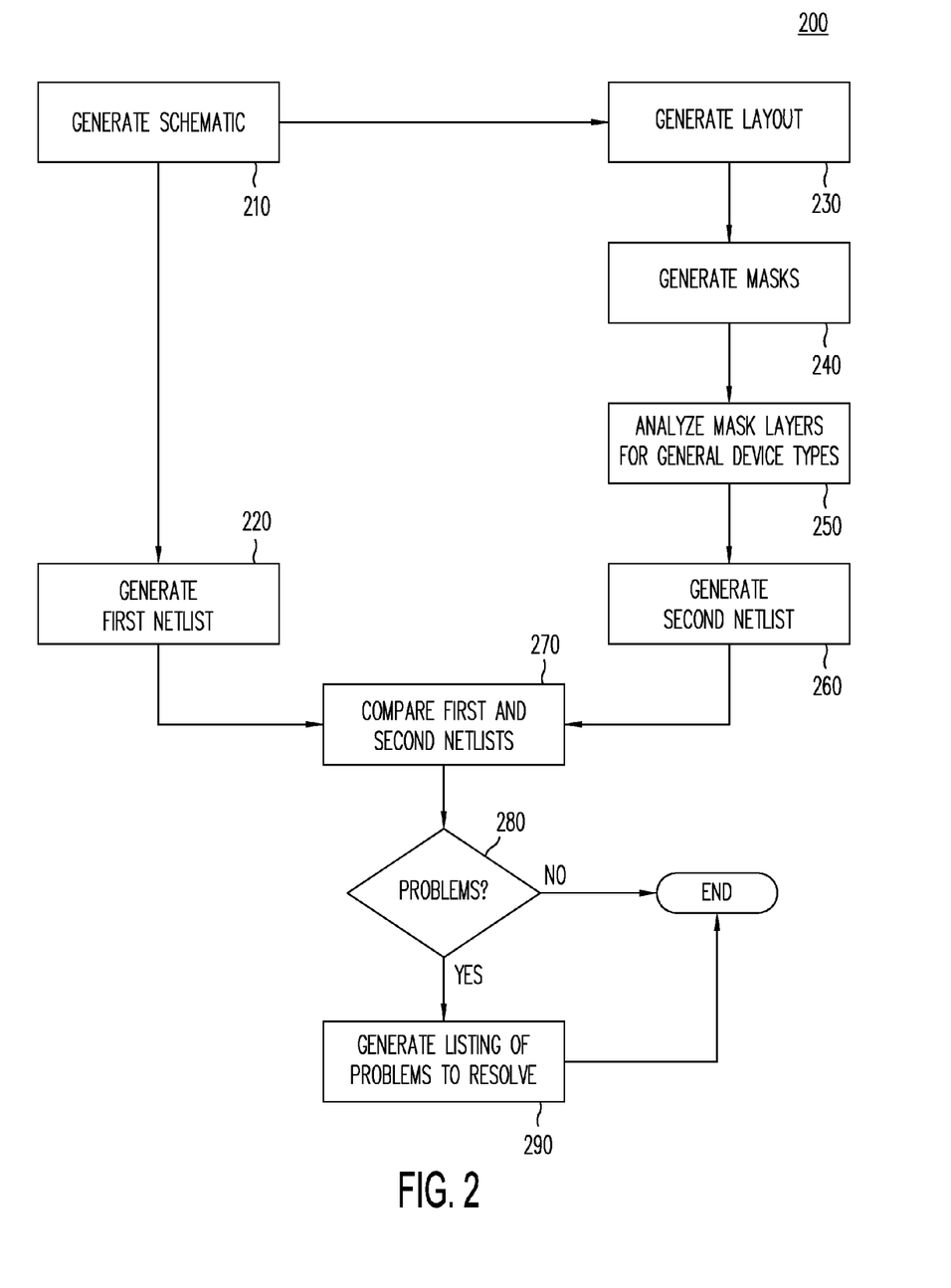
FIG. 2 is a simplified flow diagram illustrating an example of a design verification flow, in accordance with embodiments of the present invention.
Figure 3:
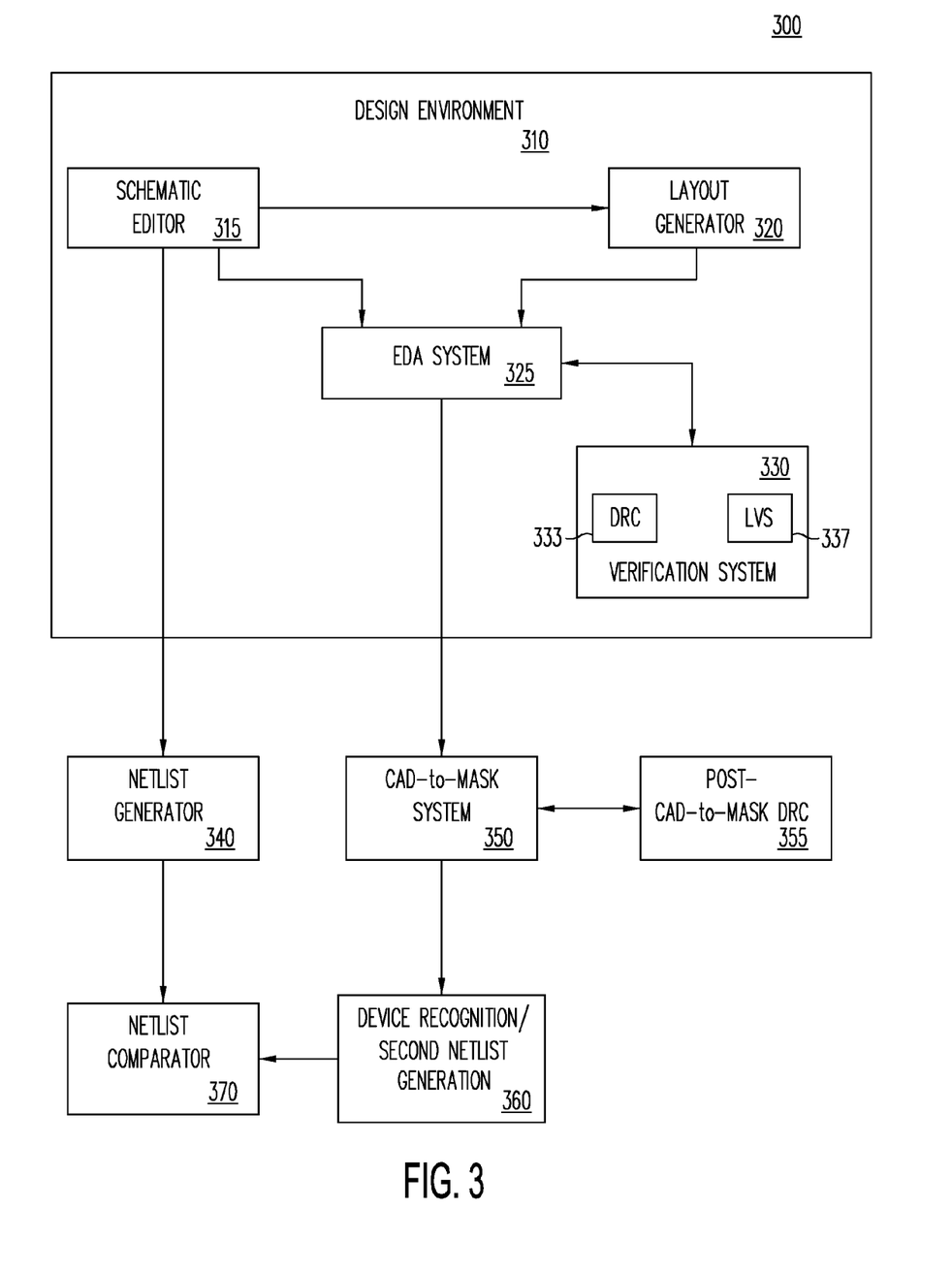
FIG. 3 is a simplified block diagram illustrating an example of a set of semiconductor device design systems configured to perform the tasks involved in the design verification flow of FIG. 2, in accordance with embodiments of the present invention.

FIG. 2 is a simplified flow diagram illustrating an example of a design verification flow 200, in accord with embodiments of the present invention. FIG. 3 is a simplified block diagram illustrating an example of a set of semiconductor device design systems 300 configured to perform the tasks involved in the design verification flow of FIG. 2, in accord with embodiments of the present invention.

An initial step in the process of a semiconductor device design is generation of a schematic (210). As discussed above, the schematic provides a graphical representation of the desired semiconductor device. In some embodiments, schematic generation can be performed using a schematic editor 315 that is a part of a design environment 310. Design environment 310 can include one or more processors or processing systems configured to provide specific functionality and coupled to or providing interface devices that enable the provision of that functionality. For example, the schematic editor can include specialized tablet input devices for input of the schematic elements as well as a specialized display to illustrate the elements and their connections. Further, the schematic editor can include libraries of schematic elements and combinations of elements available for the semiconductor device.

Once a schematic is generated, the information represented by the schematic can be used to generate device element data and connectivity information in, for example, a first netlist file (220). This first netlist file can include descriptions of the various elements of the semiconductor device as well as descriptions of how the various elements are connected using interconnection nets in the device. The first netlist file can be generated by a netlist generator module 340.

The schematic can also be used in the process of generating a CAD layout of the semiconductor device (230). One or more modules comprising a layout generator 320 can be used to perform the generation of the semiconductor device layout by a layout engineer. Generation of the layout can include combinations of standard cells representing the various elements or combinations of elements of the semiconductor device. These standard cells can include specifications for the represented elements, such as height, width, timing, power, and the like. An electronic design automation (EDA) set of tools 325 can also be used in the construction of the CAD layout. These EDA tools can be used to simulate the performance of the combined elements in the device design. In addition, the EDA tools can access a verification system 330 that ensures design rules, such as spacing and the like, are adhered to for a chosen process through a DRC module 333 and the layout and schematic connectivity and attributes are in agreement through an LVS module 337. Once the device CAD layout has been verified during the design stage, a file can be generated that includes a description of the device CAD layout (e.g., a GDS file), which is then provided to the mask generation stage of the flow.

The device IC masks are generated (240) by using, for example, a CAD-to-Mask system (350). As discussed above, in addition to generation of physical mask layers representing the CAD layout (e.g., the CAD layers), physical mask generation also includes computed layers provided by, for example, Boolean mask operations. These computed layers, such as P-well, NLDD, and the like, can be generated using the information from the CAD layers, as well as information regarding the specific process technology being used to make the physical device. In addition, CAD-to-Mask system 350 can also use optical proximity correction (OPC) to modify the mask shapes in order to compensate for optical effects associated with a particular process technology. A post-CAD-to-Mask design rule check module (355) can perform a series of rules checks to ensure that the generated masks are within the physical parameters of the process technology. If there is a violation of those rules, this information can be fed back to the CAD-to-Mask system and appropriate corrections can be made.

A result of the CAD-to-Mask process is the set of IC masks can include layers not included in the original CAD layout, and further, will often cause changes in the geometry of layout patterns. Embodiments of the present invention then determine whether the changes reflected in the set of IC masks as compared to the original description of the semiconductor device provided by the schematic are within design parameters and established rules.

The set of IC masks provided by CAD-to-Mask system 350 are then analyzed for recognized general device types (250). Once the general device types have been located, information such as the device types, locations, and layers in proximity to or interacting with those general device type locations is recorded in a second netlist-type file (260). This task of device recognition and netlist generation can be performed by one or more systems associated with device recognition and netlist generation 360. One example of such a device recognition system will be discussed in more detail below.

In order to determine whether there is agreement between the first and second netlists, the information in the netlists is compared (270). As will be discussed in more detail below, a netlist comparator 370 can compare the specific device information found in the first netlist (generated from information contained in the original device schematics) with the generalized device information and layer information found in the second netlist (generated from information contained in the IC mask data). The netlist comparator not only compares the device types located in the two netlists, but also determines whether the layers found in proximity to or interacting with the devices in the second netlist are expected, acceptable if not expected, or not acceptable, according to the design rules for the elements and combinations of elements. If there are such problems (280), then a listing of the problems, their causes, and possible solutions can be generated (290).

One reaction to the finding of such problems can be a review of the design rules that triggered a problem. If, for example, a layer that is found in proximity to a device in the IC masks is benign, then the rule can be modified to take this into account and not trigger a warning if the presence of that layer is detected. On the other hand, if a discovered layer actually causes problems with the device functionality, then there may need to be modifications of how the CAD-to-Mask procedures are performed or modifications to the design layout of the semiconductor device.

Figure 4:
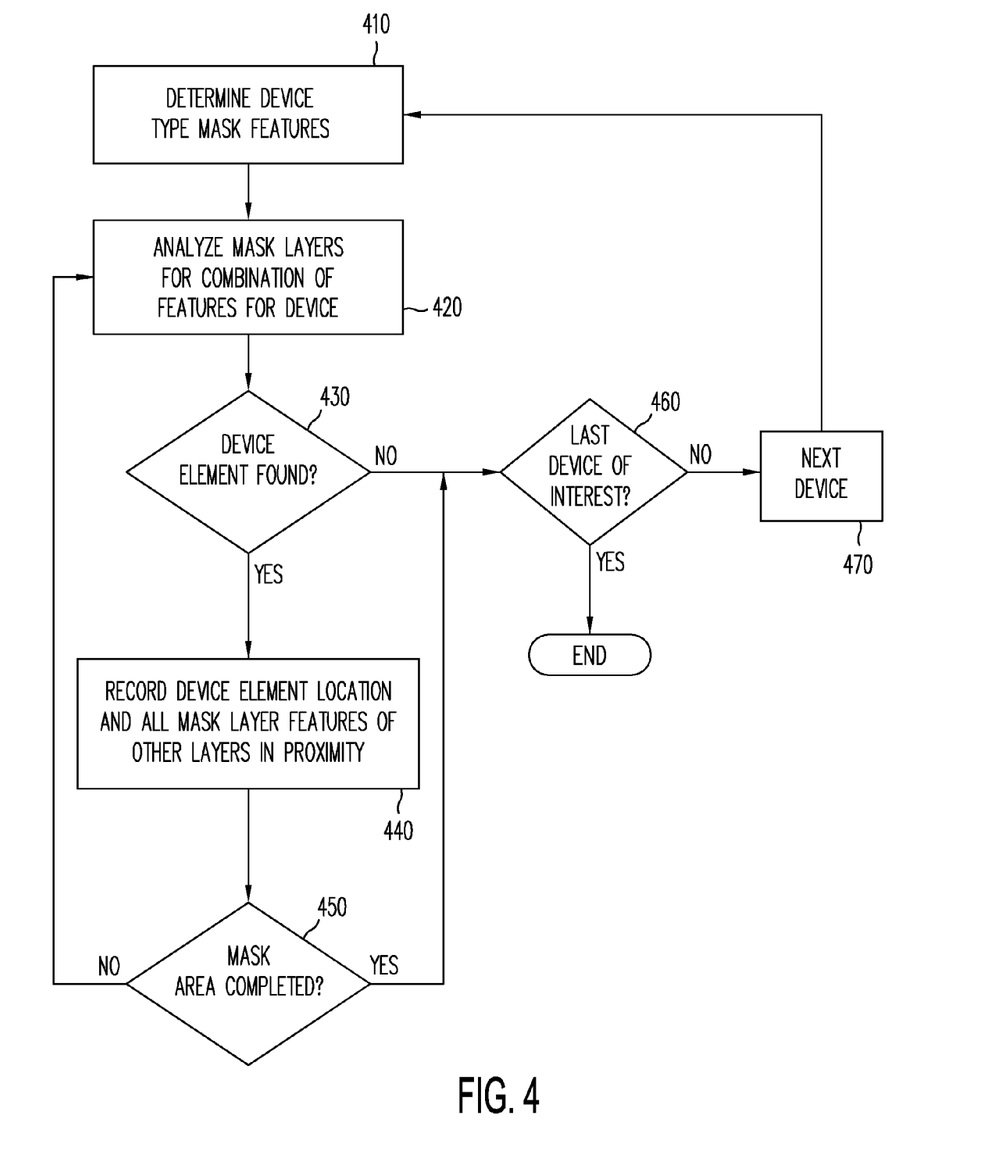
FIG. 4 is a simplified flow diagram illustrating one embodiment of a process for recognizing devices in an IC mask set, usable with embodiments of the present invention.

FIG. 4 is a simplified flow diagram illustrating one embodiment of a process for recognizing devices in an IC mask set, usable with embodiments of the present invention. All or portions of the flow represented in FIG. 4 can be provided by the device recognition and second netlist generation systems 360. One intended result of the device recognition process is to determine the locations of generalized devices within the mask sets. Each of these generalized devices will always have an associated set of active and passive layers. For a particular process technology, mask features for a device element of interest are determined (410). These mask features can typically be found in a set of seed layers that are a subset of the total number of layers in the IC mask set.

Appropriate layers of the IC mask set (e.g., the active layers and the polysilicon layers) can then be analyzed to locate the combination of mask features for the device element of interest (420). This analysis can be performed using pattern matching techniques such as those known in the art. If a set of features is located that indicates a device element of interest has been found (430), then an identifier of the device element, a location of the device element, and all mask layer features of other layers in proximity to the device location can be recorded in memory for inclusion in the second netlist file (440). If the plan area of the IC mask sets has not been completely analyzed for the device element of interest (450), then analysis continues. If the plan area of the IC mask sets has been completely analyzed for the device element of interest (450), then a determination can be made as to whether the last device of interest has been analyzed (460). If so, then the process can end. If not, then a next device element can be selected (470), and the process repeated. In this manner, a set of generic device elements defined by their necessary layers can be located, and various characteristics related to those device elements can be recorded in preparation for a comparison analysis.

Figure 5:
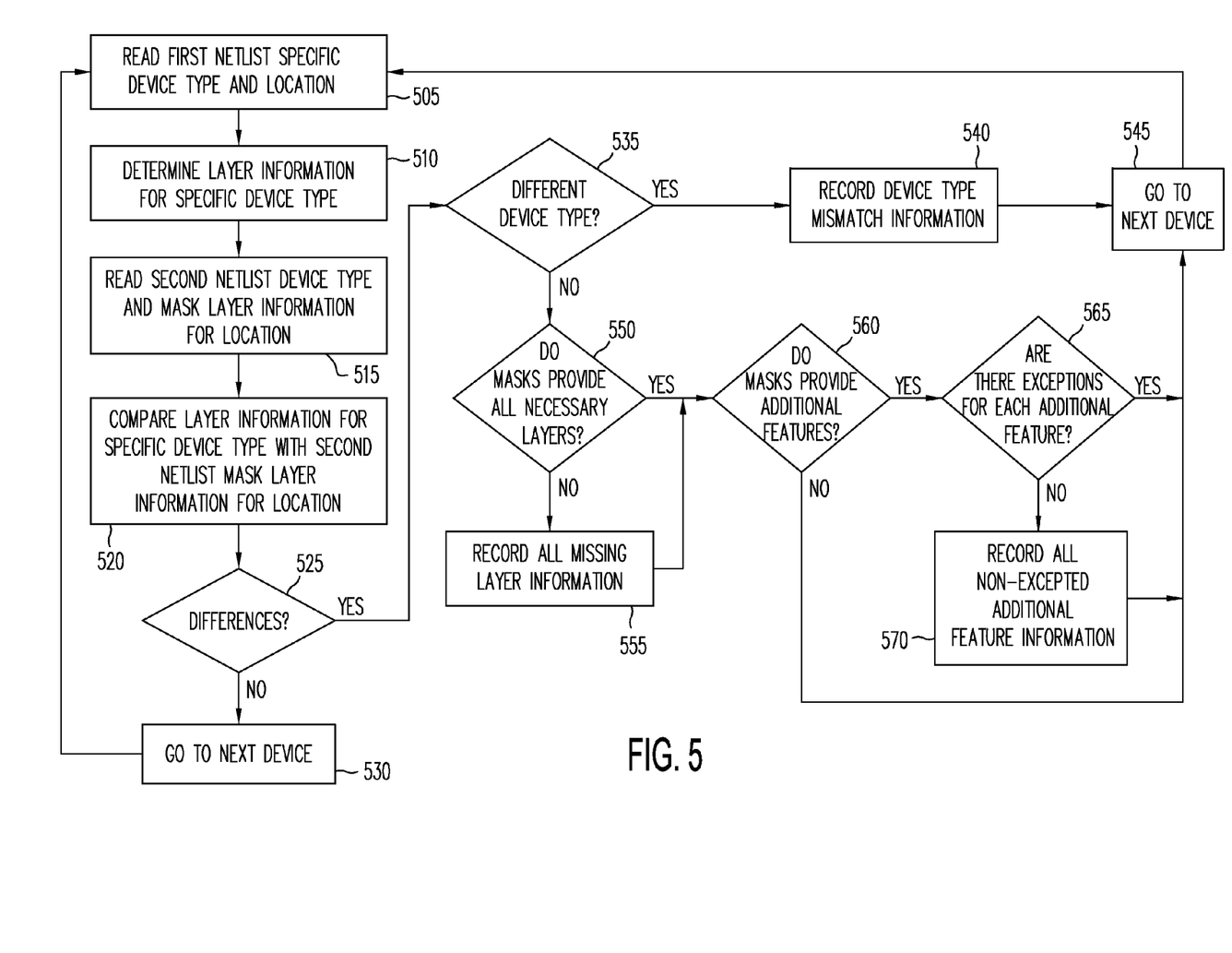
FIG. 5 is a simplified flow diagram illustrating one example of a process for comparing information in the first netlist file that includes design schematic information, with information in the second netlist file that includes IC mask set information, usable by embodiments of the present invention.

FIG. 5 is a simplified flow diagram illustrating one example of a process for comparing information in the first netlist file that includes design schematic information, with information in the second netlist file that includes IC mask set information. The first netlist file is examined for a specific device element and location (505). Such an examination can include an area scan of the first netlist file to find a first device element. A database can then be examined to determine information regarding layers and layer configurations expected for the specific device element (510). The second netlist file is then examined for a device type and mask layer information at the location suggested by the first netlist file (515).

The layer information for the specific device type, as determined from the first netlist file, is then compared with the second netlist mask layer information from the suggested location (520). The comparison can include a determination of whether all the expected layers are present and in an appropriate configuration for the device element type. The comparison can further include a determination of whether additional layers beyond those expected are present. The comparison can also include other content and geometry comparisons of interest. If there are no differences between the expected characteristics as suggested by the determinations made from the first netlist file and the device element configured by the IC mask set (525), then the process proceeds to the next device (530).

If there are differences, then a series of analyses can be performed to determine the nature of the differences between the device element described in the first and second netlist file. For example, if the IC mask layer configuration at the location relates to a different device element type (535), then the device type mismatch information can be recorded (540) and the analysis can proceed to the next device (545). If the differences do not indicate a different device element type, but instead the IC mask set does not provide all the necessary layers (550), then the missing layer information can be recorded (555).

If the IC mask set provides additional features (560), then a determination can be made as to whether there are exceptions for each additional feature (565). If there are exceptions for each additional feature, then the analysis can proceed to the next device (545). If one or more of the additional features do not have an associated exception, then all non-accepted additional feature information can be recorded (570), and analysis can proceed to the next device (545).

It should be noted that the comparison analysis illustrated in FIG. 5 is used by way of example. Additional differences of interest can also be included in the analysis in accord with concepts of the present invention. For example, certain layer combinations generated by the CAD-to-Mask process can, unintentionally, generate parasitic devices that may not be desirable in the final product. Analysis can be performed to determine whether the IC maskset netlist contains description of additional devices not included in the first netlist file generated from the schematics. Further analysis can then be performed to determine whether these additional devices are benign in nature or could cause performance issues with the intended semiconductor device.

Embodiments of the present invention provide a system and method by which a determination can be made as to whether an IC mask set generated during a design flow of a semiconductor device is in substantial agreement with the original schematic design for the semiconductor device. Through the use of such a system, corrections can be made to the various design rules or the design itself prior to fabrication of devices that may include faults. Use of such a system can save time and resources spent in correction of faulty semiconductor devices.

By now it should be appreciated that there has been provided a method implemented by a semiconductor device design system, in which the method comprises steps executed by one or more components of the semiconductor device design system. The steps include: generating, from a schematic description of a semiconductor device, a first set of data including descriptions of device elements and conductivity of the semiconductor device; generating a set of integrated circuit masks for the semiconductor device; identifying characteristics of mask device elements described by the set of integrated circuit masks; generating, from the determined mask device elements and the integrated circuit masks, a second set of data including descriptions of the identified integrated circuit mask device elements and conductivity of the semiconductor device; comparing each device element in the first set of data with a corresponding integrated circuit mask device element in the second set of data; and, recording differences, if any, between a device element in the first set of data and the corresponding integrated circuit mask device element in the second set of data, as a result of the comparing. One aspect of the above embodiment further includes storing the first set of data in a first memory, and storing the second set of data and a second memory.

In another aspect of the above embodiment, generating the set of integrated circuit masks further includes: generating a design layout corresponding to information provided by the schematic description of the semiconductor device; generating one or more CAD mask layers corresponding to the design layout; and, generating one or more additional mask layers that do not correspond to the design layout. In a further aspect, the descriptions of the identified mask device elements in the second set of data include a location in the integrated circuit of a mask device element, and information associated with each mask layer in a predefined range of the location where each mask layer includes both the one or more CAD mask layers and the one or more additional mask layers. In still a further aspect, identifying characteristics of the mask device element described by the set of integrated circuit masks includes performing a pattern matching between known mask features for a general device type and the set of integrated circuit masks. A further aspect includes storing the known mask features for the general device type in a memory.

In another aspect of the above embodiment, comparing each device element in the first set of data with a corresponding integrated circuit mask device element in the second set of data includes: reading information associated with a device element in the first set of data where the information associated with the device element in the first set of data includes a location of the device element and an identifier of the type of device element; identifying the physical mask layers associated with the type of device element; reading information associated with the corresponding integrated circuit mask device element from the second set of data where the corresponding integrated circuit mask device element is at a maskset location corresponding to the location of the device element in the first set of data and the information associated with the corresponding integrated circuit mask device element includes descriptions of mask layers at the maskset location; and, comparing the descriptions of the integrated circuit mask device element mask layers with the identified physical mask layers. In a further aspect, identifying the physical mask layers associated with the type of device element includes accessing a memory storing information associated with the physical mask layers for the type of device element. In another aspect, the differences between the device element the first set of data and the corresponding integrated circuit mask device element include missing features for the integrated circuit mask device element. In another aspect, the differences between the device element in the first set of data and the corresponding integrated circuit mask device element include additional features for the integrated circuit mask device element.

Another embodiment of the present invention provides a semiconductor device design system that includes a design environment system, a CAD-to-mask system, a device recognition system, and a comparator system. Each system of the semiconductor device design system includes a set of processors and a memory configured to store a set of instructions executable by the corresponding set of processors. The design environment system includes a first set of instructions configured to generate, from a schematic description of a semiconductor device, a first set of data including descriptions of device elements and conductivity of the semiconductor device. The CAD-to-mask system includes a second set of instructions configured to receive the first set of data, and generate a set of integrated circuit masks for the semiconductor device from the first set of data. The device recognition system includes a third set of instructions configured to receive the set of IC masks for the semiconductor device, identifying characteristics of mask device elements described by the set of IC masks, and generate from the determined mask device elements and the IC masks a second set of data including descriptions of the identified IC mask device elements and conductivity of the semiconductor device. The comparator system includes a fourth set of instructions configured to receive the first set of data and second set of data, compare each device element in the first set of data with a corresponding IC mask device element in the second set of data, and record differences, if any, between a device element in the first set of data and the corresponding IC mask device element in the second set of data, as a result of said comparing.

In one aspect of the above embodiment, the CAD-to-mask system includes additional instructions configured to generate a design layout corresponding to information provided by the schematic description of the semiconductor device, generate one or more CAD mask layers corresponding to the design layout, and generate one or more additional mask layers that do not correspond to the design layout. In a further aspect, the descriptions of the identified mass device elements in the second set of data include a location in the integrated circuit of a mask device element, and information associated with each mask layer in a predefined range of the location where each mask layer includes both the one or more CAD mask layers and the one or more additional mask layers. In yet a further aspect, the device recognition system includes additional instructions for identifying characteristics of mask device element described by the set of IC masks which include instructions configured to perform a pattern matching between known mask features for a general device type and the set of IC masks. In still a further aspect, the device recognition system further includes another memory configured to store the known mask features for the general device type.

In another aspect of the above embodiment, the comparator system includes further instructions for comparing each device element of the first set of data with the corresponding IC mask device element and the second set of data, which include instructions configured to: read information associated with a device element in the first set of data where the information associated with the device element of the first set of data includes a location of the device element and an identifier of the type of device element; identify the physical mask layers associated with the type of device element; read information associated with the corresponding IC mask device element from the second set of data where the corresponding IC mask device element is at a mask set location corresponding to the location of the device element in the first set of data, and the information associated with the corresponding IC mask device element includes descriptions of mask layers at the mask set location; and, compare the descriptions of the IC mask device element mask layers with the identified physical mask layers. In a further aspect, the instructions configured to identify the physical mask layers associated with the type of device element further includes instructions configured to access a memory storing information associated with physical mask layers for the type of device element. In another further aspect, the differences between the device element of the first set of data and the corresponding IC mask device element include missing features for the IC mask device element. In another further aspect, the differences in the device element of the first set of data and the corresponding IC mask device element include additional features for the IC mask device on.

Another embodiment of the present invention provides a computer readable storage medium, storing instructions executable by a processor, the instructions including: a first set of instructions configured to generate, from a schematic description of a semiconductor device, a first set of data comprising descriptions of device elements and conductivity of the semiconductor device; a second set of instructions configured to generate a set of integrated circuit masks for the semiconductor device; a third set of instructions configured to identify characteristics of mask device element described by the set of IC masks; a fourth set of instructions configured to generate, from the determined masked device elements and the IC masks, a second set of data including descriptions of the identified IC mask device elements and conductivity of the semiconductor device; a fifth set of instructions configured to compare each device in the first set of data with a corresponding IC mask device element in the second set of data; and, a sixth set of instructions configured to record differences, if any, between a device element in the first set of data and the corresponding IC mask device element in the second set of data, as a result of said comparing.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

The term "program," as used herein, is defined as a sequence of instructions designed for execution on an information processing system. A program, or computer program, may include a subroutine, a function, a procedure, an object method, an object implementation, an executable application, an applet, a servlet, a source code, an object code, a shared library/dynamic load library and/or other sequence of instructions designed for execution on an information processing system. The program can be implemented by software modules that perform certain tasks when executed, including those associated with the methods described above. Software modules may include script, batch, or other executable files.

Some of the above embodiments, as applicable, may be implemented using a variety of different information processing systems. For example, although FIG. 3 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, system 300 or portions thereof may be soft or code representations of physical circuitry or of logical representations convertible into physical circuitry. As such, system 300 may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Embodiments of the present invention have been described in the context of fully functional information processing systems. But those skilled in the art will appreciate that embodiments of the present invention are capable of being distributed as a program product in a variety of forms, and include various types of signal bearing media used to actually carry out the distribution. Examples of signal bearing media include recordable media such as floppy disks and CD-ROM, transmission type media such as digital and analog communications links, as well as media storage and distribution systems developed in the future.

All or some of the software described herein may be received by elements of system 300, for example, from computer readable storage media or other storage media on other information processing systems. Such computer readable storage media may be permanently, removably, or remotely coupled to an information processing system. The computer readable storage media may include, for example and without limitation, any number of the following: magnetic storage media including disk and tape storage media; optical storage media such as compact disk media (e.g., CD-ROM, CD-R, etc.) and digital video disk storage media; other nonvolatile memory storage media including semiconductor-based memory units such as FLASH memory, EEPROM, EPROM, ROM; ferromagnetic digital memories; and MRAM. Additional computer readable media that can provide the software modules comprising the software include, for example, volatile storage media including registers, buffers or caches, main memory, RAM, etc.; and data transmission media including computer networks, point-to-point telecommunication equipment, and carrier wave transmission media.

In one embodiment, system 300 is a computer system such as a personal computer system. Other embodiments may include different types of computer systems. Computer systems are information handling systems which can be designed to give independent computing power to one or more users. Computer systems may be found in many forms including but not limited to mainframes, minicomputers, servers, workstations, personal computers, notepads, personal digital assistants, electronic games, automotive and other embedded systems, cell phones and various other wireless devices. A typical computer system includes at least one processing unit, associated memory and a number of input/output (I/O) devices.

An Example Computing and Network Environment

As shown above, the present invention can be implemented using a variety of computer systems and networks. An example of one such computing and network environment is described below with reference to FIGS. 6 and 7.

Figure 6:
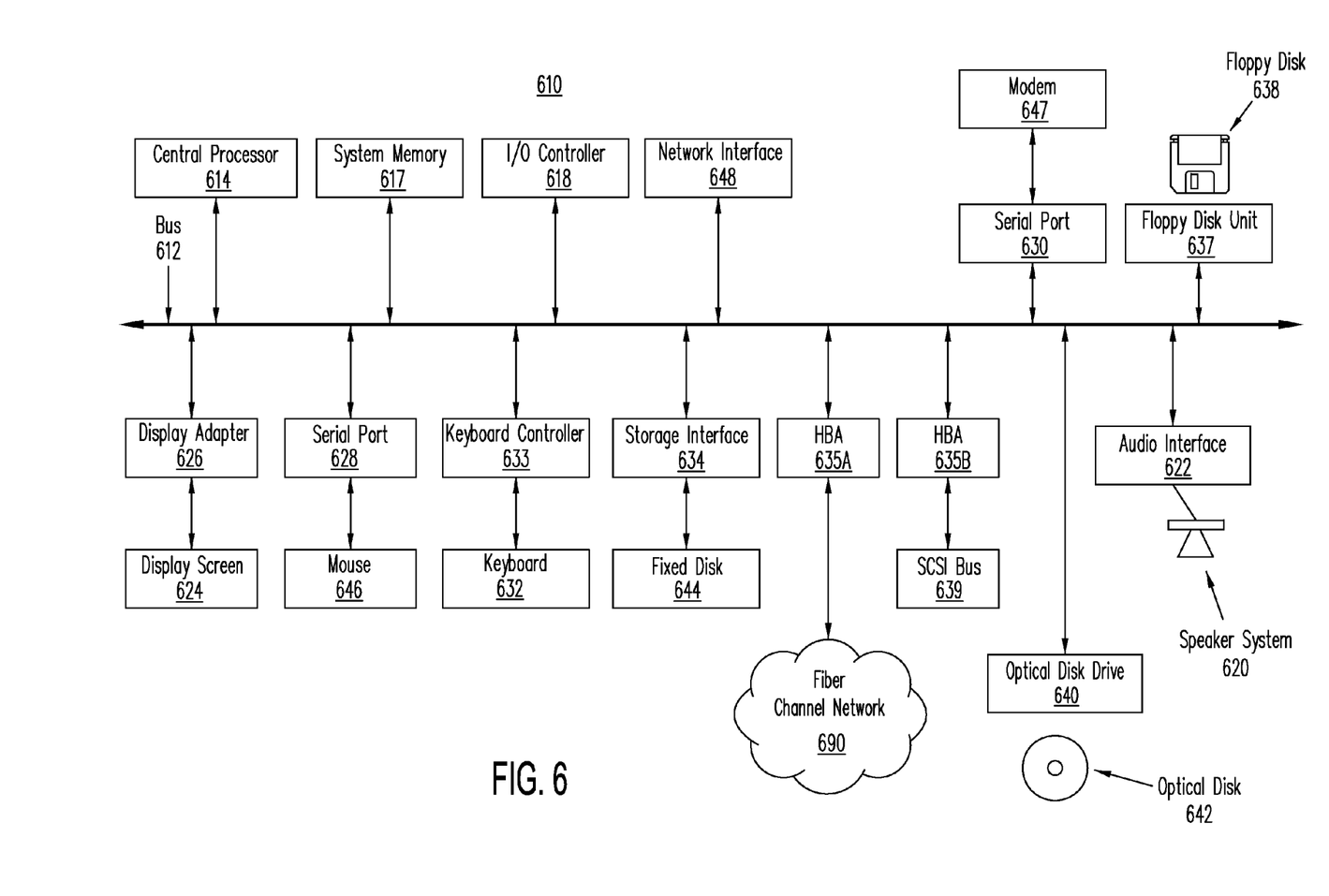
FIG. 6 is a simplified block diagram of a computer system suitable for implementing aspects of the present invention.

FIG. 6 depicts a block diagram of a computer system 610 suitable for implementing aspects of the present invention (e.g., system 300 and elements thereof). Computer system 610 includes a bus 612 which interconnects major subsystems of computer system 610, such as a central processor 614, a system memory 617 (typically RAM, but which may also include ROM, flash RAM, or the like), an input/output controller 618, an external audio device, such as a speaker system 620 via an audio output interface 622, an external device, such as a display screen 624 via display adapter 626, serial ports 628 and 630, a keyboard 632 (interfaced with a keyboard controller 633), a storage interface 634, a floppy disk drive 637 operative to receive a floppy disk 638, a host bus adapter (HBA) interface card 635A operative to connect with a Fibre Channel network 690, a host bus adapter (HBA) interface card 635B operative to connect to a SCSI bus 639, and an optical disk drive 640 operative to receive an optical disk 642. Also included are a mouse 646 (or other point-and-click device, coupled to bus 612 via serial port 628), a modem 647 (coupled to bus 612 via serial port 630), and a network interface 648 (coupled directly to bus 612).

Bus 612 allows data communication between central processor 614 and system memory 617, which may include read-only memory (ROM) or flash memory (neither shown), and random access memory (RAM) (not shown), as previously noted. The RAM is generally the main memory into which the operating system and application programs are loaded. The ROM or flash memory can contain, among other code, the Basic Input-Output system (BIOS) which controls basic hardware operation such as the interaction with peripheral components. Applications resident with computer system 610 are generally stored on and accessed via a computer-readable medium, such as a hard disk drive (e.g., fixed disk 644), an optical drive (e.g., optical drive 640), a floppy disk unit 637, or other storage medium. Additionally, applications can be in the form of electronic signals modulated in accordance with the application and data communication technology when accessed via network modem 647 or interface 648.

Storage interface 634, as with the other storage interfaces of computer system 610, can connect to a standard computer-readable medium for storage and/or retrieval of information, such as a fixed disk drive 644. Fixed disk drive 644 may be a part of computer system 610 or may be separate and accessed through other interface systems. Modem 647 may provide a direct connection to a remote server via a telephone link or to the Internet via an internet service provider (ISP). Network interface 648 may provide a direct connection to a remote server via a direct network link to the Internet via a POP (point of presence). Network interface 648 may provide such connection using wireless techniques, including digital cellular telephone connection, Cellular Digital Packet Data (CDPD) connection, digital satellite data connection or the like.

Many other devices or subsystems (not shown) may be connected in a similar manner (e.g., document scanners, digital cameras and so on). Conversely, all of the devices shown in FIG. 6 need not be present to practice the present invention. The devices and subsystems can be interconnected in different ways from that shown in FIG. 6. The operation of a computer system such as that shown in FIG. 6 is readily known in the art and is not discussed in detail in this application. Code to implement the present invention can be stored in computer-readable storage media such as one or more of system memory 617, fixed disk 644, optical disk 642, or floppy disk 638. The operating system provided on computer system 610 may be MS-DOS®, MS-WINDOWS®, OS/2®, UNIX®, Linux®, or another known operating system.

Moreover, regarding the signals described herein, those skilled in the art will recognize that a signal can be directly transmitted from a first block to a second block, or a signal can be modified (e.g., amplified, attenuated, delayed, latched, buffered, inverted, filtered, or otherwise modified) between the blocks. Although the signals of the above described embodiment are characterized as transmitted from one block to the next, other embodiments of the present invention may include modified signals in place of such directly transmitted signals as long as the informational and/or functional aspect of the signal is transmitted between blocks. To some extent, a signal input at a second block can be conceptualized as a second signal derived from a first signal output from a first block due to physical limitations of the circuitry involved (e.g., there will inevitably be some attenuation and delay). Therefore, as used herein, a second signal derived from a first signal includes the first signal or any modifications to the first signal, whether due to circuit limitations or due to passage through other circuit elements which do not change the informational and/or final functional aspect of the first signal.

Figure 7:
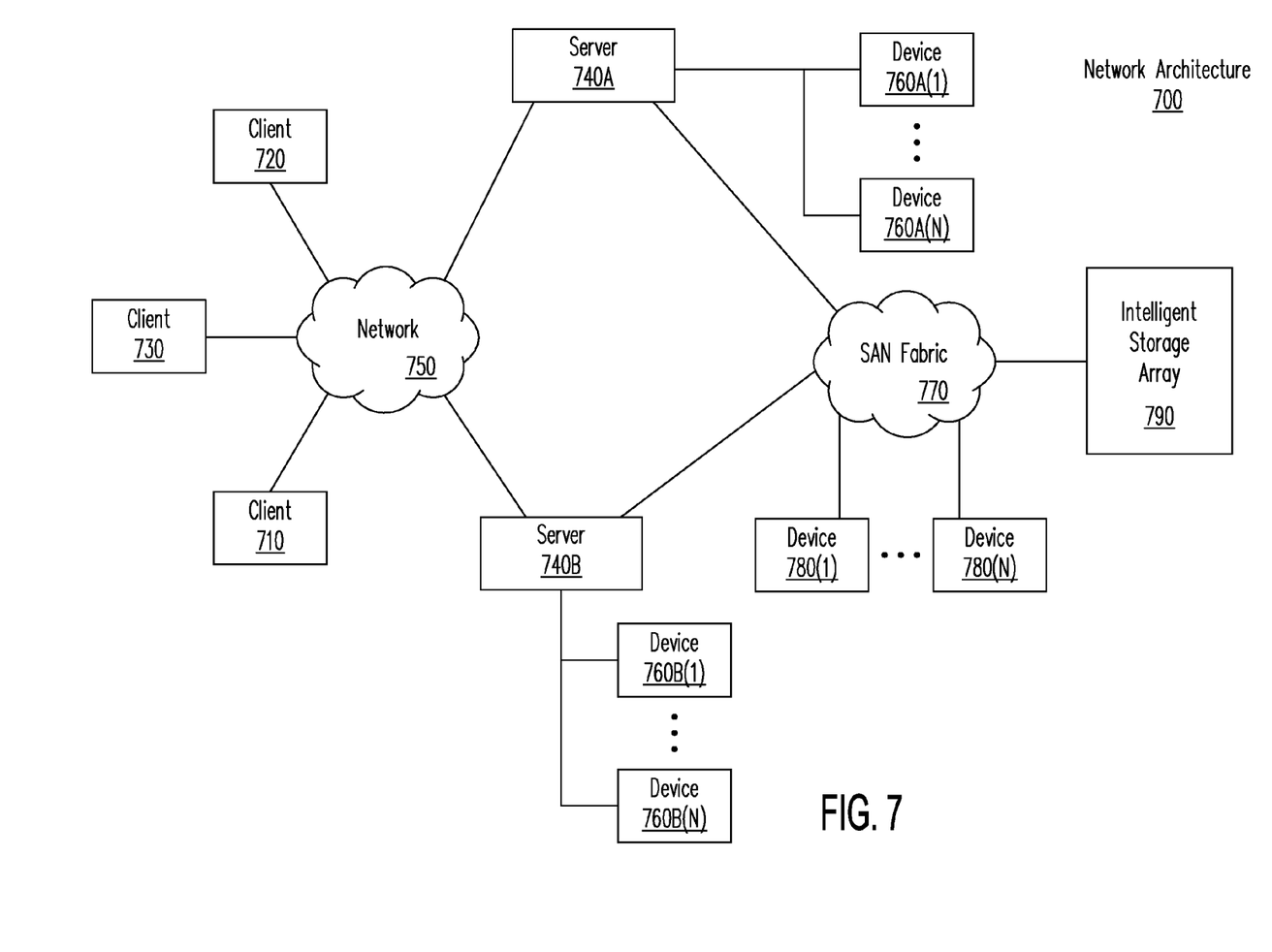
FIG. 7 is a simplified block diagram depicting a network architecture suitable for implementing aspects of the present invention.

FIG. 7 is a block diagram depicting a network architecture 700 in which client systems 710, 720 and 730, as well as storage servers 740A and 740B (any of which can be implemented using computer system 610), are coupled to a network 750. Storage server 740A is further depicted as having storage devices 760A(1)-(N) directly attached, and storage server 740B is depicted with storage devices 760B(1)-(N) directly attached. Storage servers 740A and 740B are also connected to a SAN fabric 770, although connection to a storage area network is not required for operation of the invention. SAN fabric 770 supports access to storage devices 780(1)-(N) by storage servers 740A and 740B, and so by client systems 710, 720 and 730 via network 750. Intelligent storage array 790 is also shown as an example of a specific storage device accessible via SAN fabric 770.

With reference to computer system 610, modem 647, network interface 648 or some other method can be used to provide connectivity from each of client computer systems 710, 720 and 730 to network 750. Client systems 710, 720 and 730 are able to access information on storage server 740A or 740B using, for example, a web browser or other client software (not shown). Such a client allows client systems 710, 720 and 730 to access data hosted by storage server 740A or 740B or one of storage devices 760A(1)-(N), 760B(1)-(N), 780(1)-(N) or intelligent storage array 790. FIG. 7 depicts the use of a network such as the Internet for exchanging data, but the present invention is not limited to the Internet or any particular network-based environment.

A computer system processes information according to a program and produces resultant output information via I/O devices. A program is a list of instructions such as a particular application program and/or an operating system. A computer program is typically stored internally on computer readable storage medium or transmitted to the computer system via a computer readable transmission medium. A computer process typically includes an executing (running) program or portion of a program, current program values and state information, and the resources used by the operating system to manage the execution of the process. A parent process may spawn other, child processes to help perform the overall functionality of the parent process. Because the parent process specifically spawns the child processes to perform a portion of the overall functionality of the parent process, the functions performed by child processes (and grandchild processes, etc.) may sometimes be described as being performed by the parent process.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method implemented by a semiconductor device design system, the method comprising:
generating, from a schematic description of a semiconductor device, a first set of data comprising descriptions of device elements and connectivity of the semiconductor device;
generating a set of integrated circuit (IC) masks for the semiconductor device;
identifying characteristics of mask device elements described by the set of IC masks;
generating, from the determined mask device elements and the IC masks, a second set of data comprising descriptions of the identified IC mask device elements and connectivity of the semiconductor device;
comparing each device element in the first set of data with a corresponding IC mask device element in the second set of data, wherein said comparing comprises reading information associated with a device element in the first set of data, wherein
the information associated with the device element in the first set of data comprises a location of the device element and an identifier of the type of device element,
identifying physical mask layers associated with the type of device element, wherein the physical mask layers correspond to expected mask layers for the type of device element,
reading information associated with the corresponding IC mask device element from the second set of data, wherein
the corresponding IC mask device element is at a maskset location corresponding to the location of the device element in the first set of data, and
the information associated with the corresponding IC mask device element comprises descriptions of mask layers at the maskset location, and
comparing the descriptions of the IC mask device element mask layers with the identified physical mask layers;
recording differences, if any, between a device element in the first set of data and the corresponding IC mask device element in the second set of data, as a result of said comparing;
generating a set of modified IC masks using the recorded differences; and
fabricating the semiconductor device using set of modified IC masks.

2. The method of claim 1 further comprising:
storing the first set of data in a first memory; and
storing the second set of data in a second memory.

3. The method of claim 1 wherein said generating the set of IC masks comprises:
generating a design layout corresponding to information provided by the schematic description of the semiconductor device;
generating one or more mask layers corresponding to the design layout; and
generating one or more additional mask layers that do not correspond to the design layout.

4. The method of claim 3, wherein the descriptions of the identified mask device elements in the second set of data comprise:
a location in the integrated circuit of a mask device element; and
information associated with each mask layer in a predefined range of the location, wherein each mask layer comprises both the one or more mask layers corresponding to the design layout and the one or more additional mask layers.

5. The method of claim 4 wherein said identifying characteristics of mask device elements described by the set of IC masks comprises:
performing a pattern matching between known mask features for a general device type and the set of IC masks.

6. The method of claim 5 further comprising:
storing the known mask features for the general device type in a memory.

7. The method of claim 1 wherein said identifying the physical mask layers associated with the type of device element comprises:
accessing a memory storing information associated with the physical mask layers for the type of device element.

8. The method of claim 1 wherein the differences between the device element in the first set of data and the corresponding IC mask device element comprise missing features for the IC mask device element.

9. The method of claim 1 wherein the differences between the device element in the first set of data and the corresponding IC mask device element comprise additional features for the IC mask device element.

10. A semiconductor device design system comprising:
a design environment system, comprising a first set of processors and a first memory configured to store a first set of instructions executable by the first set of processors, the first set of instructions configured to
generate, from a schematic description of a semiconductor device, a first set of data comprising descriptions of device elements and connectivity of the semiconductor device;
a CAD-to-Mask system, comprising a second set of processors and a second memory configured to store a second set of instructions executable by the second set of processors, the second set of instructions configured to
receive the first set of data, and
generate a set of integrated circuit (IC) masks for the semiconductor device from the first set of data;
a device recognition system, comprising a third set of processors and a third memory configured to store a third set of instructions executable by the third set of processors, the third set of instructions configured to
receive the set of IC masks for the semiconductor device,
identify characteristics of mask device elements described by the set of IC masks, and
generate, from the determined mask device elements and the IC masks, a second set of data comprising descriptions of the identified IC mask device elements and connectivity of the semiconductor device; and
a comparator system, comprising a fourth set of processors and a fourth memory configured to store a fourth set of instructions executable by the fourth set of processors, the fourth set of instructions configured to
receive the first set of data and the second set of data,
compare each device element in the first set of data with a corresponding IC mask device element in the second set of data, wherein said instructions to compare further comprise instructions configured to
read information associated with a device element in the first set of data, wherein
the information associated with the device element in the first set of data comprises a location of the device element and an identifier of the type of device element,
identify physical mask layers associated with the type of device element, wherein the physical mask layers correspond to expected mask layers for the type of device element,
read information associated with the corresponding IC mask device element from the second set of data, wherein
the corresponding IC mask device element is at a maskset location corresponding to the location of the device element in the first set of data, and
the information associated with the corresponding IC mask device element comprises descriptions of mask layers at the maskset location, and
compare the descriptions of the IC mask device element mask layers with the identified physical mask layers; and
record differences, if any, between a device element in the first set of data and the corresponding IC mask device element in the second set of data, as a result of said comparing.

11. The semiconductor device design system of claim 10 wherein the second memory, associated with the CAD-to-Mask system, is configured to store additional instructions, the additional instructions configured to
generate a design layout corresponding to information provided by the schematic description of the semiconductor device;
generate one or more mask layers corresponding to the design layout; and
generate one or more additional mask layers that do not correspond to the design layout.

12. The semiconductor device design system of claim 11, wherein the descriptions of the identified mask device elements in the second set of data comprise:
a location in the integrated circuit of a mask device element; and
information associated with each mask layer in a predefined range of the location, wherein each mask layer comprises both the one or more mask layers corresponding to the design layout and the one or more additional mask layers.

13. The semiconductor device design system of claim 12 wherein the third set of instructions, associated with the device recognition system, configured to identify characteristics of mask device elements described by the set of IC masks further comprises instructions configured to:
perform a pattern matching between known mask features for a general device type and the set of IC masks.

14. The semiconductor device design system of claim 13 wherein the device recognition system further comprises:
a fifth memory configured to store the known mask features for the general device type.

15. The semiconductor device design system of claim 10 wherein the instructions configured to identify the physical mask layers associated with the type of device element further comprises instructions configured to:
access a memory storing information associated with the physical mask layers for the type of device element.

16. The semiconductor device design system of claim 10 wherein the differences between the device element in the first set of data and the corresponding IC mask device element comprise missing features for the IC mask device element.

17. The semiconductor device design system of claim 10 wherein the differences between the device element in the first set of data and the corresponding IC mask device element comprise additional features for the IC mask device element.

18. A non-transitory computer readable storage medium, storing instructions executable by a processor, the instructions comprising:
a first set of instructions configured to generate, from a schematic description of a semiconductor device, a first set of data comprising descriptions of device elements and connectivity of the semiconductor device;
a second set of instructions configured to generate a set of integrated circuit (IC) masks for the semiconductor device;
a third set of instructions configured to identify characteristics of mask device elements described by the set of IC masks;
a fourth set of instructions configured to generate, from the determined mask device elements and the IC masks, a second set of data comprising descriptions of the identified IC mask device elements and connectivity of the semiconductor device;
a fifth set of instructions configured to compare each device element in the first set of data with a corresponding IC mask device element in the second set of data, wherein the fifth set of instructions further comprise instructions configured to
read information associated with a device element in the first set of data, wherein
the information associated with the device element in the first set of data comprises a location of the device element and an identifier of the type of device element,
identify physical mask layers associated with the type of device element, wherein the physical mask layers correspond to expected mask layers for the type of device element, read information associated with the corresponding IC mask device element from the second set of data, wherein
the corresponding IC mask device element is at a maskset location corresponding to the location of the device element in the first set of data, and
the information associated with the corresponding IC mask device element comprises descriptions of mask layers at the maskset location, and
compare the descriptions of the IC mask device element mask layers with the identified physical mask layers; and
a sixth set of instructions configured to record differences, if any, between a device element in the first set of data and the corresponding IC mask device element in the second set of data, as a result of said comparing.

\* \* \* \* \*